United States Patent [19]
Iida et al.

[11] Patent Number: 5,644,157
[45] Date of Patent: Jul. 1, 1997

[54] HIGH WITHSTAND VOLTAGE TYPE SEMICONDUCTOR DEVICE HAVING AN ISOLATION REGION

[75] Inventors: Makio Iida, Ichinomiya; Shoji Miura, Nukata-gun; Takayuki Sugisaka, Okazaki; Toshio Sakakibara, Nishio; Osamu Ishihara, Nagoya, all of Japan

[73] Assignee: Nippondenso Co., Ltd., Kariya, Japan

[21] Appl. No.: 653,924

[22] Filed: May 22, 1996

Related U.S. Application Data

[63] Continuation of Ser. No. 256,868, filed as PCT/JP93/01866, Dec. 24, 1993 published as WO94/15360, Jul. 7, 1994, abandoned.

[30] Foreign Application Priority Data

Dec. 25, 1992 [JP] Japan ................. 4-346414
Feb. 2, 1993 [JP] Japan ................. 5-015338

[51] Int. Cl.$^6$ .................. H01L 29/73; H01L 29/80; H01L 27/06
[52] U.S. Cl. .................. 257/521; 257/520; 257/506; 257/508; 257/487; 257/526
[58] Field of Search ............... 257/524, 520, 257/523, 504, 508–510, 487, 493, 505

[56] References Cited

U.S. PATENT DOCUMENTS

| | | |
|---|---|---|
| 3,990,102 | 11/1976 | Okuhara et al. |
| 4,231,056 | 10/1980 | Taylor .................. 257/520 |
| 4,470,062 | 9/1984 | Muramatsu .............. 257/520 |
| 4,661,202 | 4/1987 | Ochii . |
| 4,819,054 | 4/1989 | Kawaji et al. .......... 257/528 |
| 4,907,063 | 3/1990 | Okada et al. ........... 257/520 |
| 4,980,748 | 12/1990 | Hozumi et al. ......... 257/520 |
| 5,241,210 | 8/1993 | Nakagawa et al. ...... 257/520 |
| 5,449,946 | 9/1995 | Sakakibara et al. ..... 257/487 |

FOREIGN PATENT DOCUMENTS

| | | |
|---|---|---|
| 48-100081 | 12/1973 | Japan . |
| 60-060753 | 4/1985 | Japan .................. 257/487 |
| 61-48968 | 3/1986 | Japan . |
| 63-065641 | 3/1988 | Japan . |
| 63-236343 | 10/1988 | Japan . |
| 2-58864 | 2/1990 | Japan . |
| 3-110852 | 5/1991 | Japan . |
| 3-116877 | 5/1991 | Japan . |
| 3-148852 | 6/1991 | Japan . |
| 4-186746 | 7/1992 | Japan . |
| 4-239154 | 8/1992 | Japan . |
| 91/11028 | 7/1991 | WIPO . |
| 0006622 | 4/1993 | WIPO .................. 257/520 |

*Primary Examiner*—Sara W. Crane
*Assistant Examiner*—Alexander Oscar Williams
*Attorney, Agent, or Firm*—Cushman, Darby & Cushman IP Group of Pillsbury Madison & Sutro LLP

[57] ABSTRACT

A semiconductor device which can compatibly achieve the improvement of the withstand voltage and the integration degree. A PN junction between a buried collector region 3 and a collector withstand voltage region 4 is subjected to reverse bias, and a depletion layer in the PN junction reaches a side dielectric isolation region 9a which dielectrically isolates the side of the collector withstand voltage region 4. A circumferential semiconductor region 14 which is in adjacency to the collector withstand voltage with the side dielectric isolation region 9a therebetween has an electric potential that is approximate to that at a base region 5 rather than that at the buried collector region 3. As a result, the depletion layer is subjected to the effect of low electric potential from both the base region 5 and the circumferential semiconductor region 14. This mitigates electrostatic focusing in the vicinity of the corner parts between the sides of the base region 5 and the bottom thereof, restraining the avalanche breakdown there and improving the withstand voltage there.

30 Claims, 16 Drawing Sheets

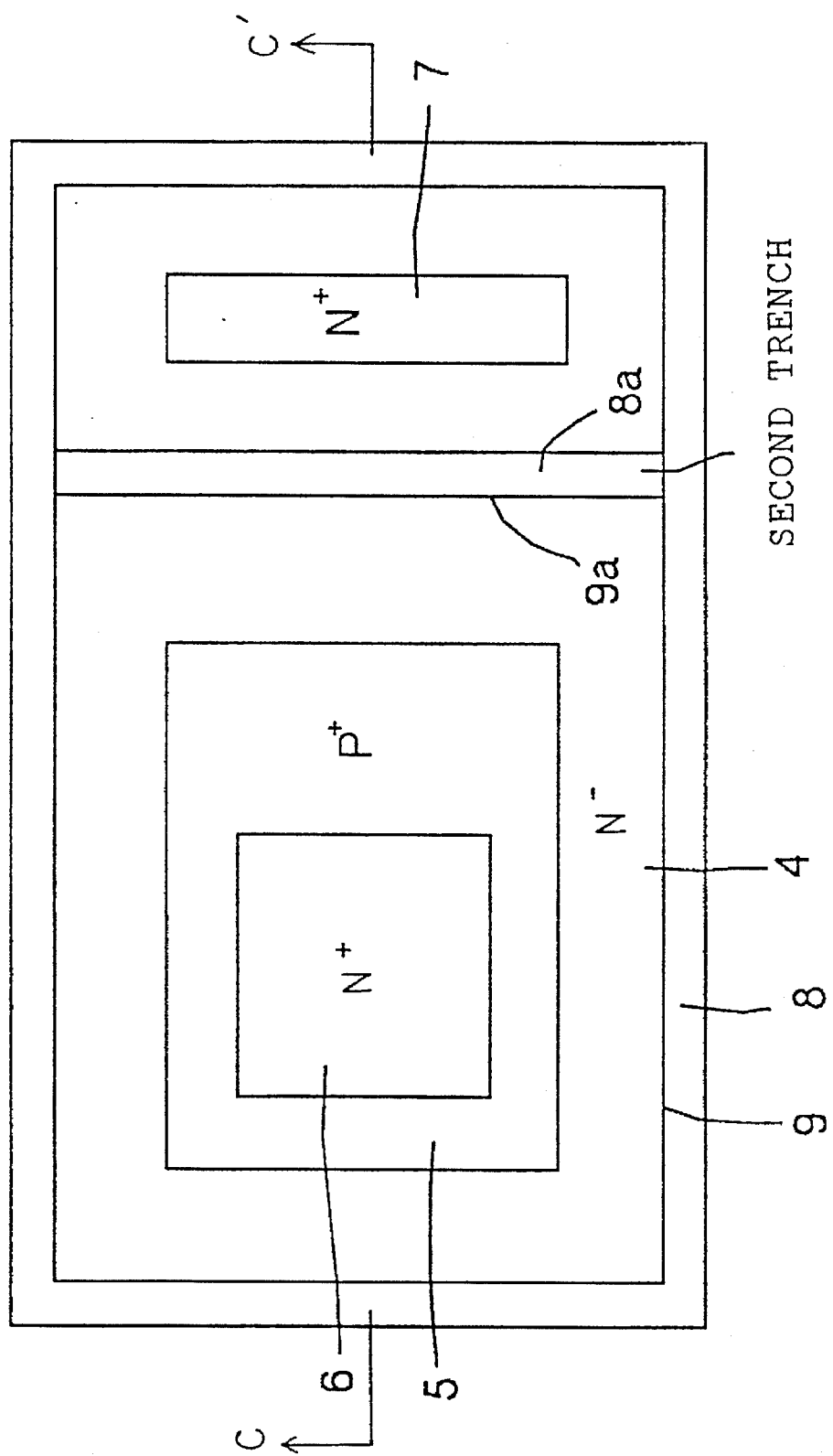

HIGH WITHSTAND VOLTAGE TYPE SEMICONDUCTOR DEVICE HAVING AN ISOLATION REGION

This is a continuation of application Ser. No. 08/256,868, filed as PCT/JP93/01866, Dec. 24, 1993 published as WO94/15360, Jul. 7, 1994, now abandoned.

TECHNICAL FIELD

The present invention generally relates to a semiconductor device. More particularly, the present invention relates to a high withstand voltage type semiconductor device which is dielectrically isolated at least at the sides thereof.

BACKGROUND ART

In a semiconductor device to be loaded on a vehicle, such as a microcomputer for controlling the vehicle engine used in a high noise environment, the first priority should be given to the withstand voltage despite some disadvantages therefore, such as the slight degradation of the integration degree or an increase in the number of manufacturing processes. This purpose is most suitably served by a transistor integrated circuit of side dielectric isolation structure or total (side and bottom) dielectric isolation structure (as disclosed in the Japanese Unexamined Patent Publication No. 48-100081).

An example of high withstand voltage type NPN bipolar transistors of total dielectric isolation structure is illustrated in FIG. 27. In this figure, reference number 3 denotes a buried collector region; 101, a low concentration collector withstand voltage region; 102, a high concentration base region; 103, an emitter region; 100, a bottom dielectric isolation oxide film; and 104, a side dielectric isolation oxide film.

In this bipolar transistor, as a high voltage is applied to between the base region 102 and the buried collector region 3, a base/collector junction J is subjected to a strong reverse bias, and a depletion layer DL (not illustrated) thereof greatly extends into the collector withstand voltage region 101 engulfing the base region 102.

In the high withstand voltage semiconductor device of the above structure, it is so designed that depletion layer DL in the base/collector junction J can not reach the buried collector region 3. Similarly, it is also designed so that the base region 102 is sufficiently separated from the side dielectric isolation oxide film 104 so as not to allow the depletion layer DL to reach the side isolation oxide film 104.

The depletion layer DL in the base/collector junction J is designed so as to be separated from the buried collector region 3. One of the reasons for this arrangement in design is that the contact of the depletion layer DL in the base/collector junction J (corresponding to the gate/drain junction of power MOSFET) with the buried collector region 3 (corresponding to the drain area of power MOSFET) would have an effect on the collector current due to a change in the collector voltage when the transistor is switched ON.

Another reason for the above design arrangement is that an increase in the reverse bias voltage between the base and the collector after the arrival of the depletion layer DL in the buried collector region would allow the depletion layer DL to extend to the base side, causing an increase in the base resistance, i.e., leading to a change in the electric characteristics and ending up in a punch through phenomena between the emitter and the collector.

On the other hand, the depletion layer DL in the base/collector junction J is designed so as to be separated from the side dielectric isolation oxide film 104. One of the reasons for this design arrangement is that the formation of a transistor similar to the above transistor in a conduction region (not illustrated) which is in contact with the depletion layer DL through the side dielectric isolation oxide film 104 would cause the withstand voltage characteristics of the transistor to be degraded due to the effect of the electric potential at the conductive region on the profile of the depletion layer DL.

Nevertheless, higher withstand voltage performance is required for the above conventional high withstand transistor.

Of course, the lower the concentration of impurities in the collector withstand voltage region 101 is, the wider the depletion layer DL is, and the higher the withstand voltage performance is. However, in order to prevent the extension of the depletion layer DL to the side dielectric isolation oxide film 104 and/or the buried collector region 3 due to the expansion of the depletion layer DL, the collector withstand voltage region 101 should be expanded in lateral width and depth. The increase in the lateral width and depth of the collector withstand voltage region 101, however, would degrade the integration degree of the transistor.

In view of the above, it is an object of the present invention to provide an semiconductor device which can compatibly improve both the withstand voltage performance and the integration degree.

DISCLOSURE OF THE INVENTION

In order to achieve the above object, the present invention is characterized by such an arrangement that voltage, which allows a depletion layer between a semiconductor layer within an element region and an islandish semiconductor region to reach a side dielectric isolation region, is applied between the semiconductor layer and the islandish semiconductor region, and a semiconductor region adjacent thereto has an electric potential which is more approximate to that at the islandish semiconductor region than to that at the element region.

In the above composition according to the present invention, a PN junction between the semiconductor layer within the element region and the islandish semiconductor region is subjected to reverse bias, and the depletion layer thereof reaches the side dielectric isolation region.

Here, the semiconductor region adjacent to the semiconductor layer within the element region with the side dielectric isolation region therebetween has an electric potential approximate to that at the islandish semiconductor region rather than to that at the semiconductor layer within the element region.

As a result, the electric potential within the adjacent semiconductor region exerts an electrostatic effect on the depletion layer adjacent to the side dielectric isolation region therethrough, deforming the depletion layer between the islandish semiconductor region and the side dielectric isolation region.

In this case, as the electric potential at the adjacent semiconductor region is set to be approximate to that at the islandish semiconductor region rather than to that at the semiconductor layer within the element region, the above depletion layer is subjected to the effect of the electric potential from both the islandish semiconductor region and the adjacent semiconductor region. This mitigates the concentration of the electric field in the vicinity of a corner part between the side and bottom of the islandish semiconductor region, restraining the avalanche breakdown at the corner part.

As the withstand voltage of this semiconductor device is dependent on the above avalanche breakdown at the corner part of the surface semiconductor region, the withstand voltage is improved when the avalanche breakdown is restrained. Furthermore, as the above depletion layer can be used in a position where the depletion later is in contact with the side dielectric isolation region, superb results can be achieved, such as the narrowed width of the semiconductor withstand voltage region and the raised integration degree.

BRIEF DESCRIPTION OF DRAWINGS

FIG. 21 is a plane view of the semiconductor device according to the fourth embodiment;

DESCRIPTION OF PREFERRED EMBODIMENTS

First Embodiment

A high withstand voltage NPN bipolar transistor of total dielectric isolation structure will now be described as a first embodiment of a semiconductor device according to the present invention.

Figure 1:
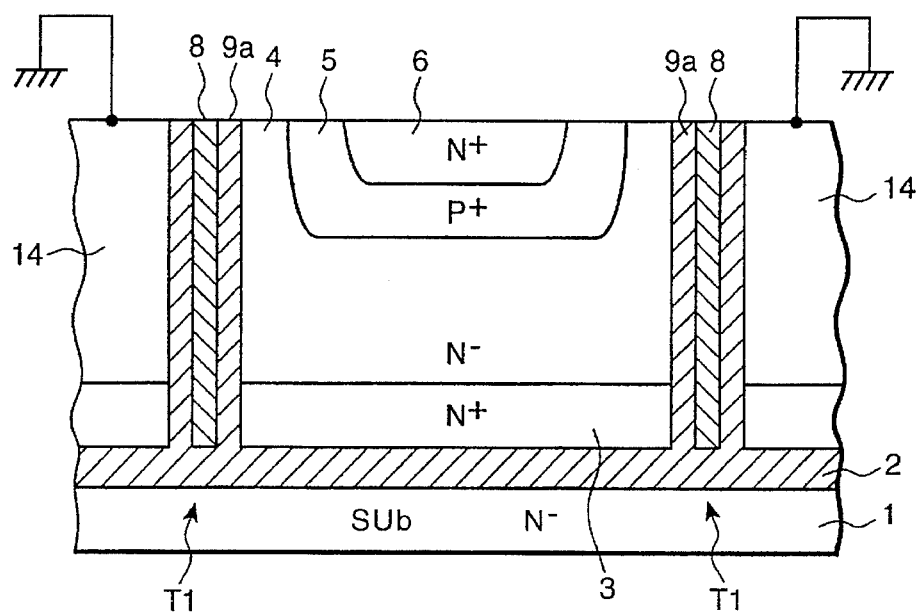
FIG. 1 is a cross-sectional view illustrating a semiconductor device according to the first embodiment.
Figure 2:
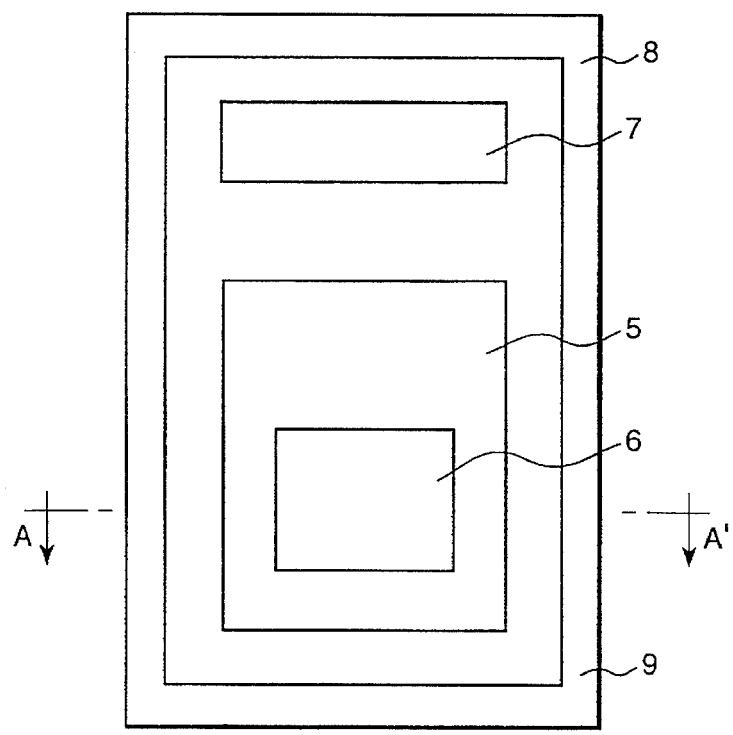
FIG. 2 is a plane view of FIG. 1.

FIG. 1 is a cross-sectional view taken along line A—A' in FIG. 2 which is a top view illustrating this embodiment. In FIG. 1, reference number 1 denotes an $N^-$ silicon substrate (substrate); 2, a bottom silicon oxide film for bottom dielectric isolation (bottom dielectric isolation region); 3, an $N^+$ buried collector region (high concentration semiconductor layer); 4, an $N^-$ collector withstand voltage region (low concentration semiconductor layer); 5, $P^+$ base region (islandish semiconductor region); 6, $N^+$ emitter region; 8, a polysilicon trench filled region for trench filling (polysilicon region); 9a, a side silicon oxide film (side dielectric isolation region); and 14, a circumferential semiconductor region (adjacent semiconductor region) which is grounded. Reference number 7 in FIG. 2 denotes an $N^+$ surface collector region. In FIG. 1, a region in which the polysilicon trench filled region 8 is caught between the side silicon oxide films 9a is referred to as trench T1.

The manufacturing processes for this transistor will be described below.

Figure 3:
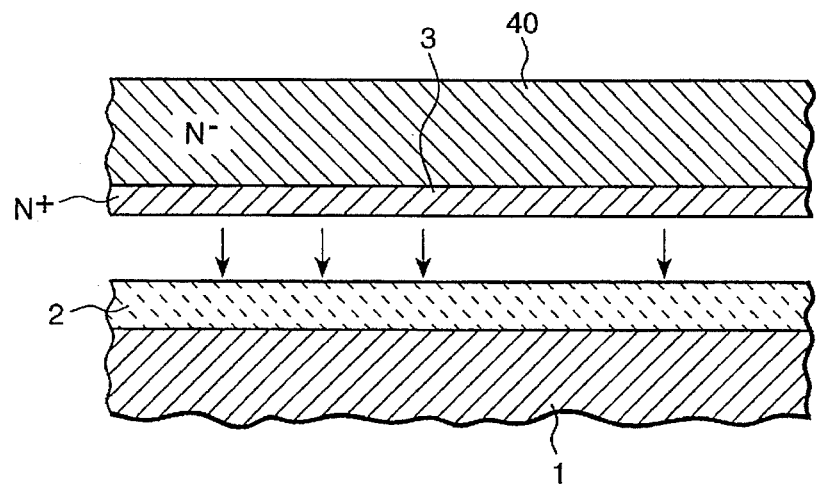
FIG. 3 is a cross-sectional view illustrating a manufacturing process for the semiconductor device according to the first embodiment.

First, as illustrated in FIG. 3, the $N^-$ type (100) monocrystalline silicon substrate 40 with a specific resistance of 3–5 Ω·cm with the $N^+$ diffused layer 3 formed thereon is prepared. The bottom silicon oxide film 2 is formed over the surface of the $N^-$ substrate 1 to a thickness of 1.0 μm by means of thermal oxidation. The silicon substrate 1 and the silicon substrate 40 are heated in a mixed fluid of $H_2O_2$—$H_2SO_4$ for hydrophilic treatment. Then, these silicon substrates 1 and 40 are joined together at room temperature, and subjected to heat treatment in the $N_2$ atmosphere at 1,100° C. for 2 hours for bonding.

Figure 4:
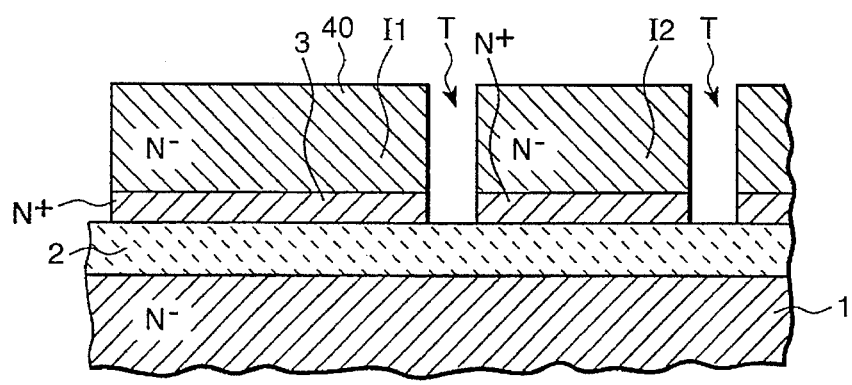
FIG. 4 is a cross-sectional view illustrating a manufacturing process for the first embodiment.

Following the above, as illustrated in FIG. 4, the silicon substrate 40 is mirror finished to the predetermined thickness to make a silicon on insulator (SOI), and a mask oxide film for trench etching (not illustrated) is formed on the surface of the SOI. Then, the specified oxide film mask pattern is formed by the normal photolithography and a trench region T (trench T) which reaches the bottom silicon oxide film 2 is formed by dry etching. This trench T forms monocrystalline islandish semiconductor regions I1 and I2 which are three-dimensionally separated by the trench T.

Figure 5:
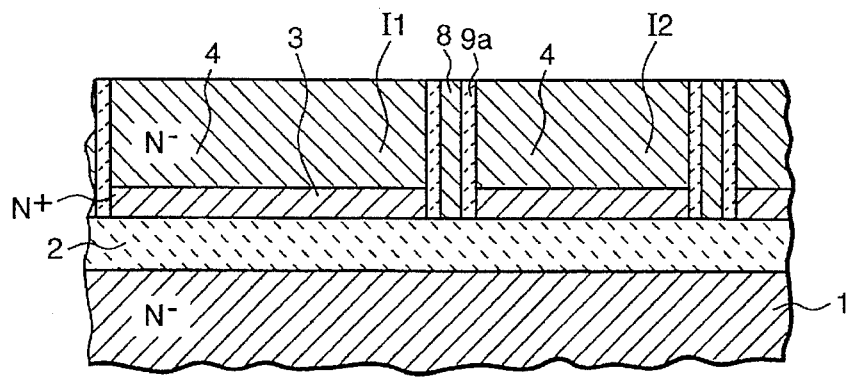
FIG. 5 is a cross-sectional view illustrating a manufacturing process for the first embodiment.

Next, as illustrated in FIG. 5, silicon oxide film (not illustrated) is formed to be 0.5 to 1 μm thick by thermal oxidation to dielectrically isolate the top and sides of the respective islandish semiconductor regions I1 and I2 for protection. Then, the trench T is filled with deposits of polysilicon. Furthermore, the islandish semiconductor regions I1 and I2 are polished until the silicon oxide film thereof is removed to smooth the surface. Finally, the side dielectric isolation regions 9a are formed to dielectrically isolate the islandish semiconductor region and the polysilicon trench filled region 8 is formed to fill the trench T between the side dielectric isolation regions 9a. At this time, the polysilicon trench filling region 8 is set to be low in donor impurity concentration.

Figure 6:
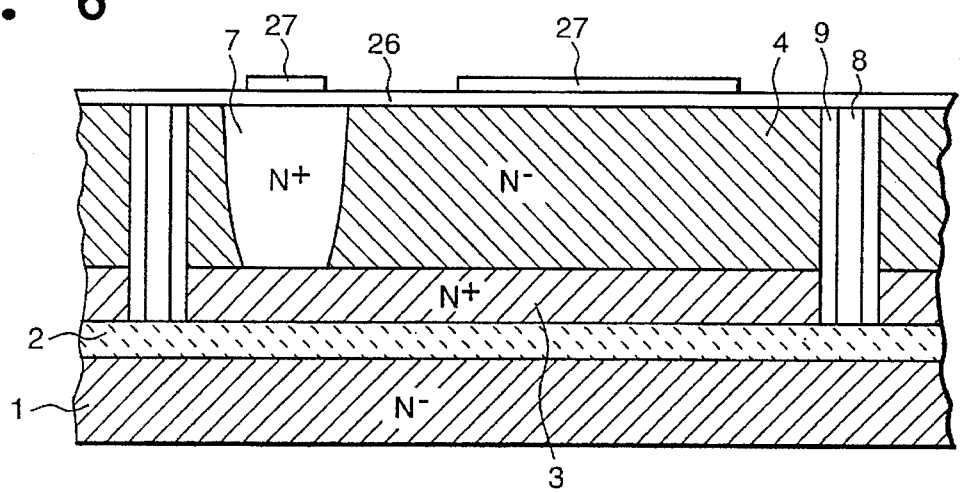
FIG. 6 is a cross-sectional view illustrating a manufacturing process for the first embodiment.
Figure 7:
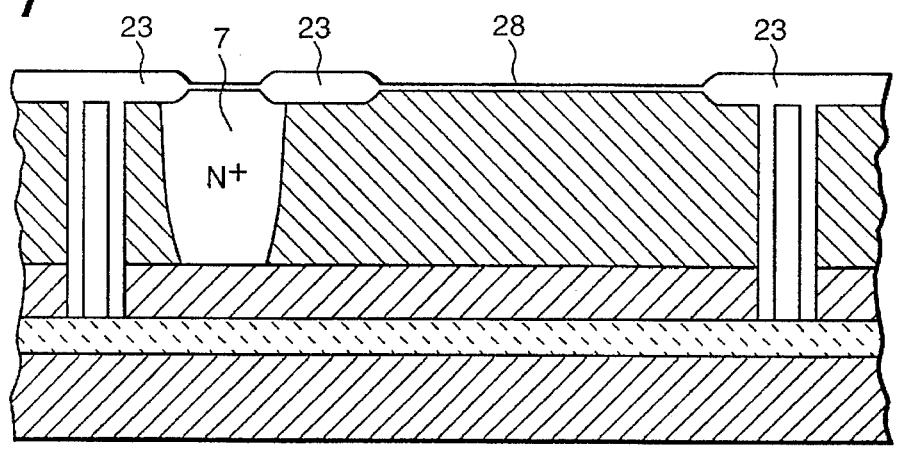
FIG. 7 is a cross-sectional view illustrating a manufacturing process for the first embodiment.

Then, the N$^+$ collector contact region 7 illustrated in FIG. 6 is formed by ion-implanting and driving ions therein. A localized oxidation of silicon (LOCOS) process illustrated in FIGS. 6 and 7 follows. In this process, a silicon oxide film 26 as a pad is formed, and $Si_3N_4$ films 27 are formed thereon. Then, the LOCOS is performed at 1,050° C. in the wet HCl atmosphere for approximately 5 hours to form a field dielectric isolation film 23 of approximately 1 µm thick (FIG. 7). Successively, the $Si_3N_4$ films 27 and the silicon oxide film 26 as a pad are removed, and a thin silicon oxide film (430 angstrom thick) 28 is formed there instead.

Figure 8:
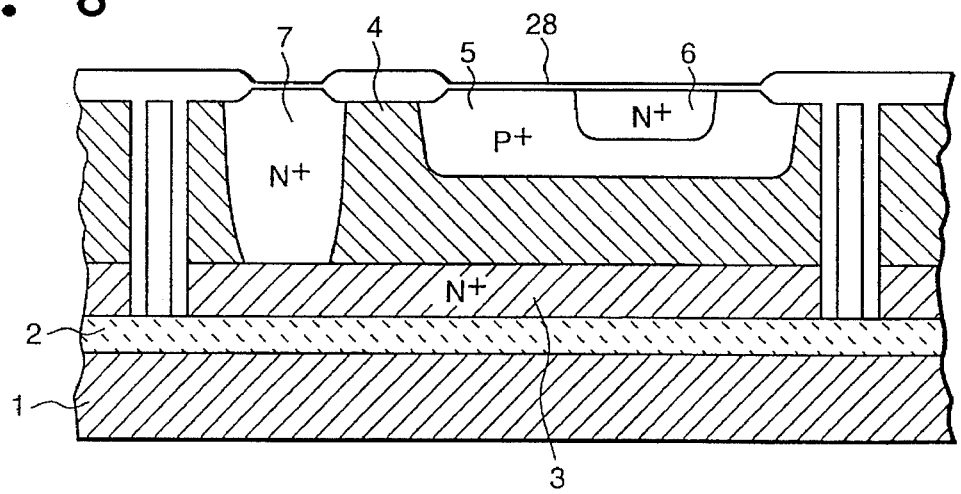
FIG. 8 is a cross-sectional view illustrating a manufacturing process for the first embodiment.

Next, as illustrated in FIG. 8, boron is ion implanted for $2.1 \times 10^{14}$ dose/cm$^2$ at 80 keV, and driven in at 1,170° C. for approximately 1 hour after a photoresist mask 31 for ion-implanting is removed. Furthermore, phosphorous is ion implanted for $7.0 \times 10^{15}$ dose/cm$^2$ at 130 keV and driven in at 1,050° C. for approximately 4 hours to form the P$^+$ base region 5 and the N$^+$ emitter region 6. The processes subsequent to this are the same as the conventional manufacturing processes, for which reason the description thereof will be omitted herein.

The important part of this embodiment will now be described in detail.

First, the parameters of the respective parts are set as follows:

The impurity concentration in the N$^-$ collector withstand voltage region 4 is $1 \times 10^{15}$ atoms/cm$^3$, the impurity concentration in the surface of the P$^+$ base region 5 is $3 \times 10^{18}$ atoms/cm$^3$, the impurity concentration in the surface of the N$^+$ emitter region 6 is $1 \times 10^{20}$ atoms/cm$^3$, the distance between the base region 5 on the surface of the collector withstand voltage region 4 and the side dielectric isolation region 9 is 2.5 µm, and the thickness of the collector withstand voltage region 4 between the base region 5 and the buried collector region 3 is 4 µm.

Next, a description will be given to voltage to be applied.

In this embodiment, 0 V is applied to the circumferential semiconductor region 14 partitioned from the element region in which bipolar transistor is formed by the trench T1 and to the emitter region 6 and the maximum collector voltage (power voltage, e.g., 50 V) is applied to the collector contact region 7 (i.e., buried collector region 3). Therefore, when the electric potential is 0 V at the base region 5, the depletion layer of the base/collector junction may not reach the buried collector region 3 but reach the trench T1.

In other words, the low electric potential at the circumferential semiconductor region 14 exerts an electrostatic effect on the collector withstand voltage region 4 in the vicinity of the sides of the base region 5 through the trench T1 (to electrostatically lower the electric potential) and mitigate the electric field of the depletion layer of the collector withstand voltage region 4 in the vicinity of the sides of the base region 5. This mitigates the electric field of the depletion layer in the vicinity of the corner parts of the base region 5, where the electric field concentration is the most intensive and the first avalanche breakdown occurs, and improves the withstand voltage.

How to improve the withstand voltage by grounding the outer semiconductor region will now be described referring to a transistor model illustrated in FIG. 9 and the relation between the flat surface shape and withstand voltage of the base region 5 illustrated in FIGS. 10, 11 and 12.

Figure 9:
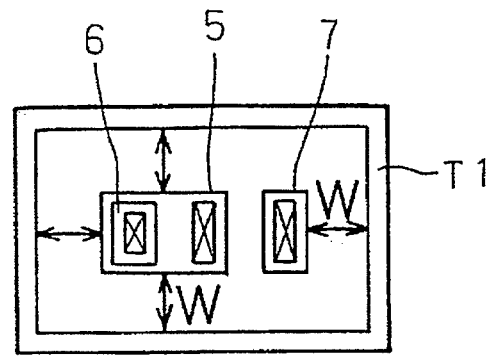
FIG. 9 is a plane view illustrating a model of the semiconductor device used for simulation.

The reference numbers in FIG. 9 correspond to those in FIG. 1, and the crossed regions in FIG. 9 indicate contact regions contacting with wiring layers.

Figure 10:
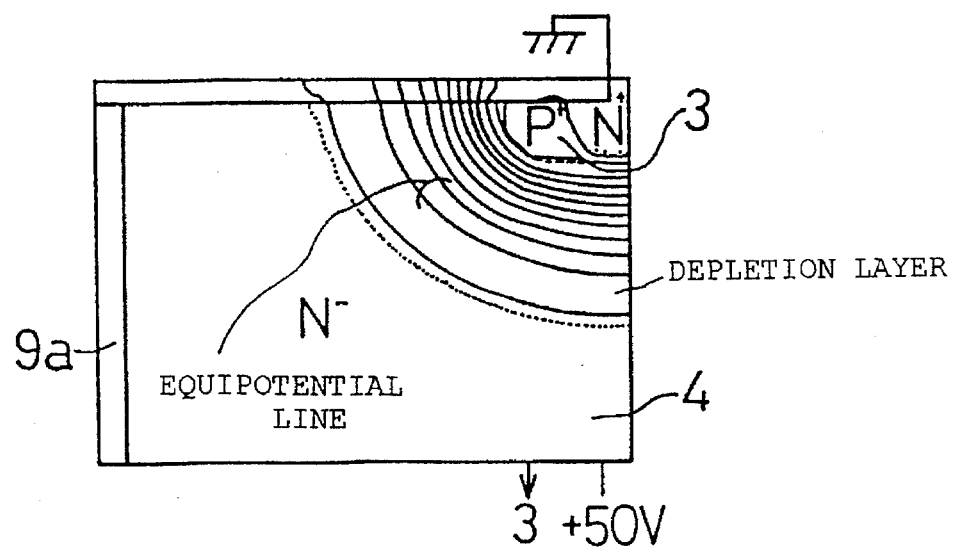
FIG. 10 is a cross-sectional view illustrating the profile of a depletion layer formed in the semiconductor device according to the first embodiment.
Figure 11:
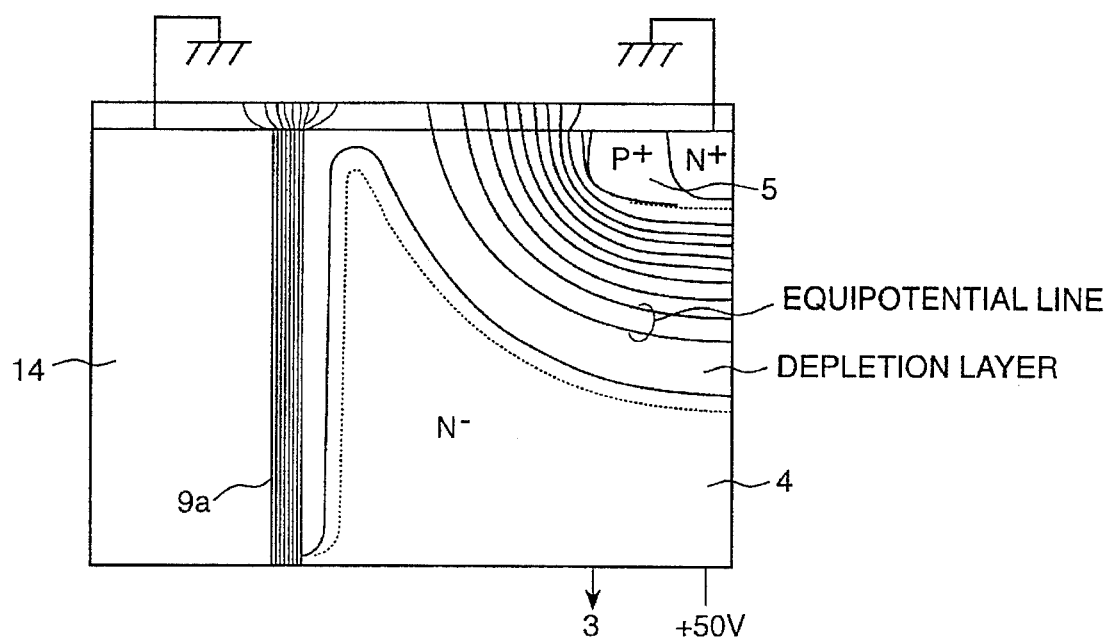
FIG. 11 is a cross-sectional view illustrating the profile of a depletion layer formed in the semiconductor device according to the first embodiment.
Figure 12:
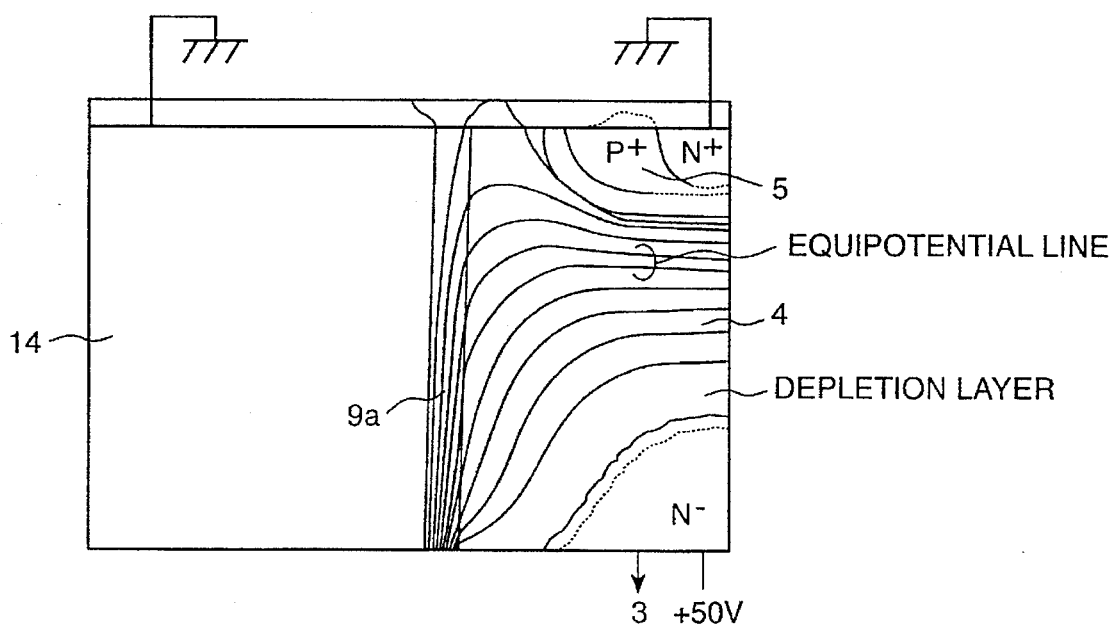
FIG. 12 is a cross-sectional view illustrating the profile of a depletion layer formed in the semiconductor device according to the first embodiment.

The above depletion layer shape was simulated at a base/collector voltage of 50 V, and the results of this simulation are illustrated in FIGS. 10, 11 and 12. FIG. 10 shows a case where the distance between the base region 5 and the side dielectric isolation region 9 is 15 µm, FIG. 11 shows a case of 10 µm in that distance, and FIG. 12 shows a case of 5 µm in that distance. All the other conditions are the same as the above. From FIGS. 10, 11 and 12, it is understood that when the depletion layer reaches the trench T1, the effect of the high electric potential at the buried collector region 3 is less likely to exert the effect on the corner parts of the base region 5 due to the effect of the low electric potential at the circumferential semiconductor region 14.

Figure 13:
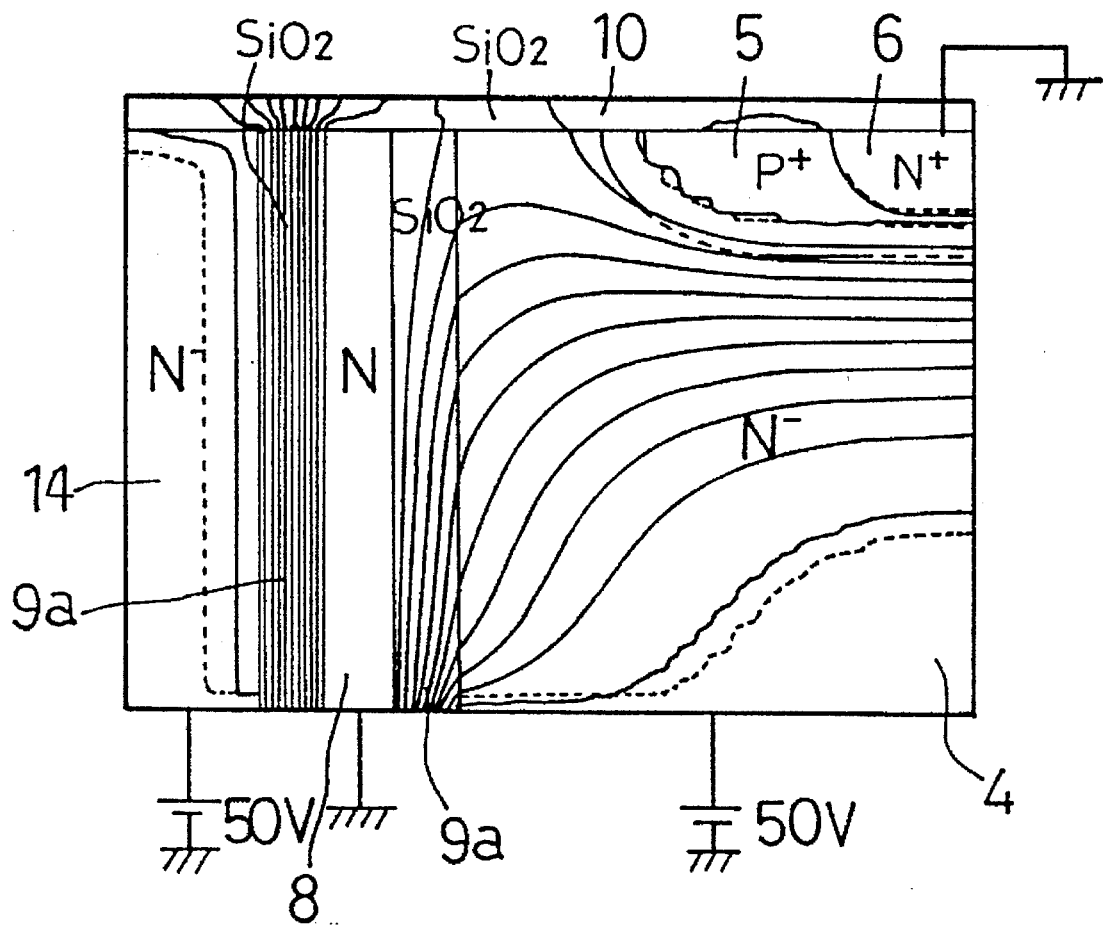
FIG. 13 is a cross-sectional view illustrating the profile of a depletion layer formed in the semiconductor device according to the first embodiment.

In the above embodiment, the polysilicon trench filled region 8 is made low in impurity concentration to realize a floating electric potential, and the circumferential semiconductor region 14 that is dielectrically isolated from the element region by the trench T1 is grounded. Alternatively, however, it may be arranged so that the impurity concentration of the polysilicon region 8 is raised by means of depositing or subsequent phosphorous doping during the formation thereof to be high (e.g., $10^{20}$ atoms/cm$^3$) and then this polysilicon region 8 is grounded. This case was also simulated under the conditions that the low electric potential action was the same as the above (W=5 µm) and similar transistors were formed in the outer semiconductor region 11. The results of this simulation are illustrated in FIG. 13. It is understood from FIG. 13 that there is electric field mitigating action in the same way as when the circumferential semiconductor region 14 is grounded.

In the following embodiments, either the polysilicon trench filled region 8 should be made high in impurity concentration and grounded to achieve the low electric potential state or the outer semiconductor region partitioned by the trench T1 should be grounded to achieve the low electric potential state and may be freely chosen, or both the polysilicon trench filled region 8 and the outer semiconductor region may be grounded.

Figure 14:
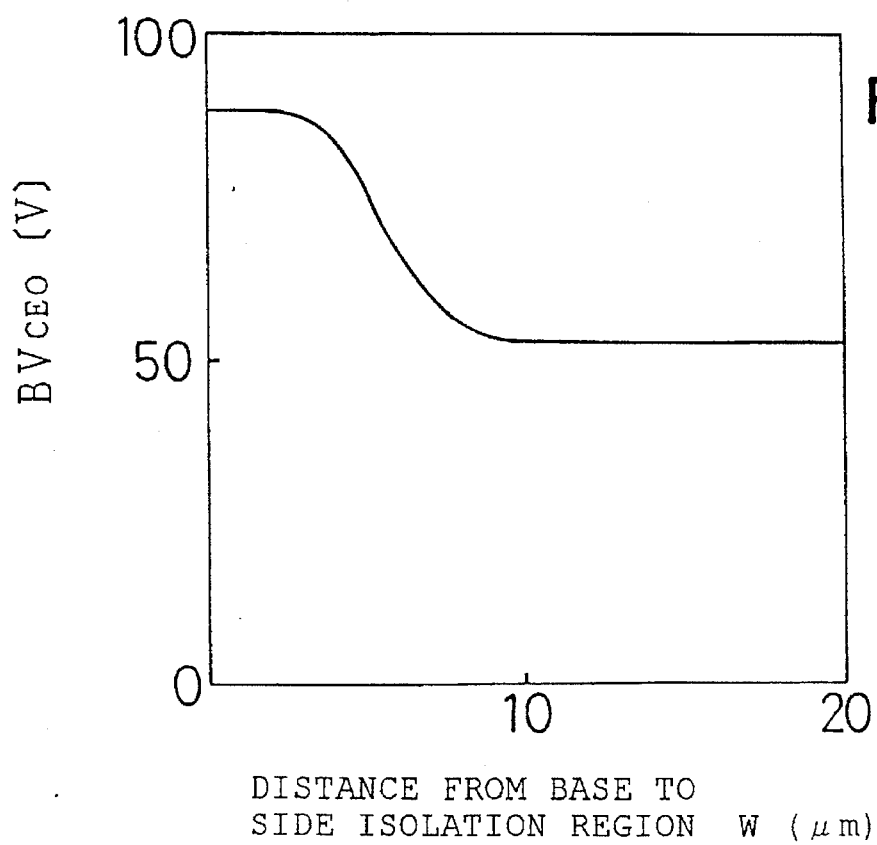
FIG. 14 is a characteristic diagram illustrating the results of the simulation of the relation between the withstand voltage and distance of the semiconductor device according to the first embodiment.

The change in the collector to emitter withstand voltage with the base in the open state $BV_{CEO}$ was simulated with the distance W between the base region 5 and the side silicon oxide film 9a changed and all the other conditions remaining the same. The results of this simulation are illustrated in FIG. 14. The depletion layer width at this time was 9 µm. It is understood from this figure that when the depletion layer reaches the side silicon oxide film 9a, $BV_{CEO}$ can be improved.

Figure 15:
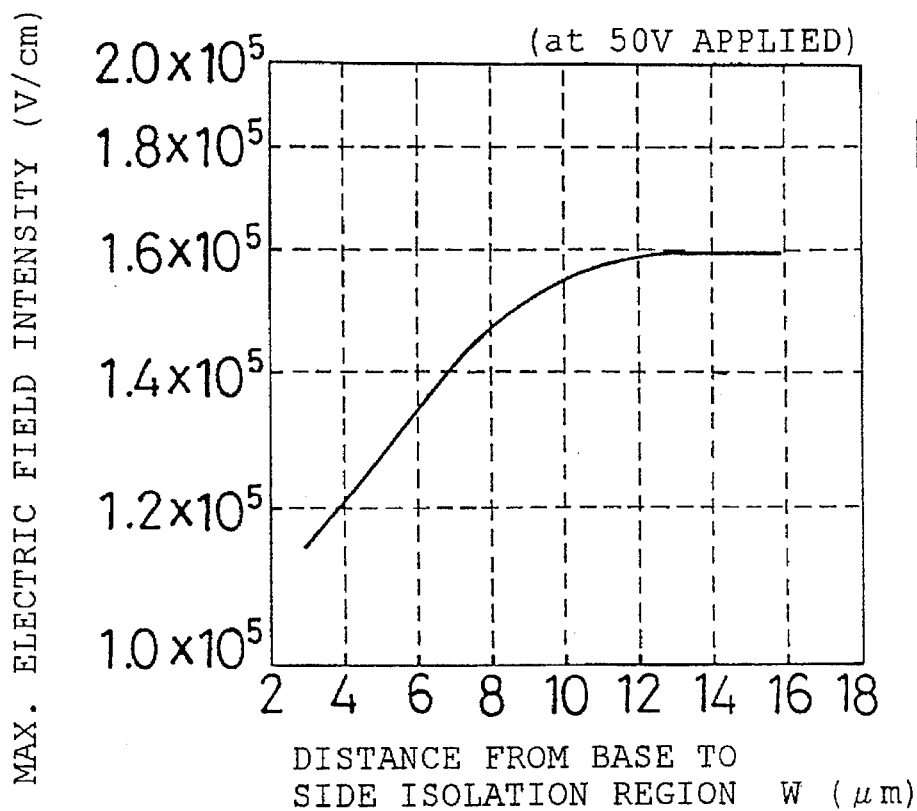
FIG. 15 is a characteristic diagram illustrating the results of the calculation of the relation between the maximum electric field intensity and distance of the semiconductor device according to the first embodiment.

The maximum electric field intensity of the depletion layer when the distance W between the base region 5 and the side silicon oxide film 9a is changed is illustrated in FIG. 15. It is understood from this figure that as the distance W becomes smaller, the maximum electric field intensity of the depletion layer becomes smaller.

Figure 16A:
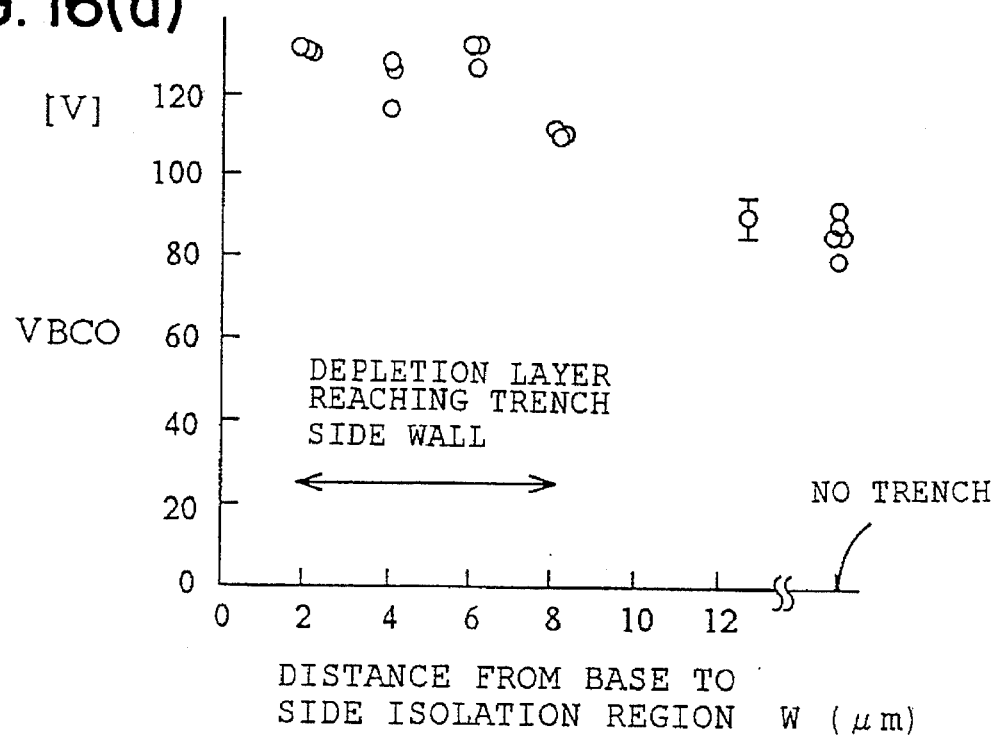
FIG. 16(a) and FIG. 16(b) are characteristic diagrams illustrating the results of the measurements of the relation between the withstand voltage and distance of the semiconductor according to the first embodiment.
Figure 16B:
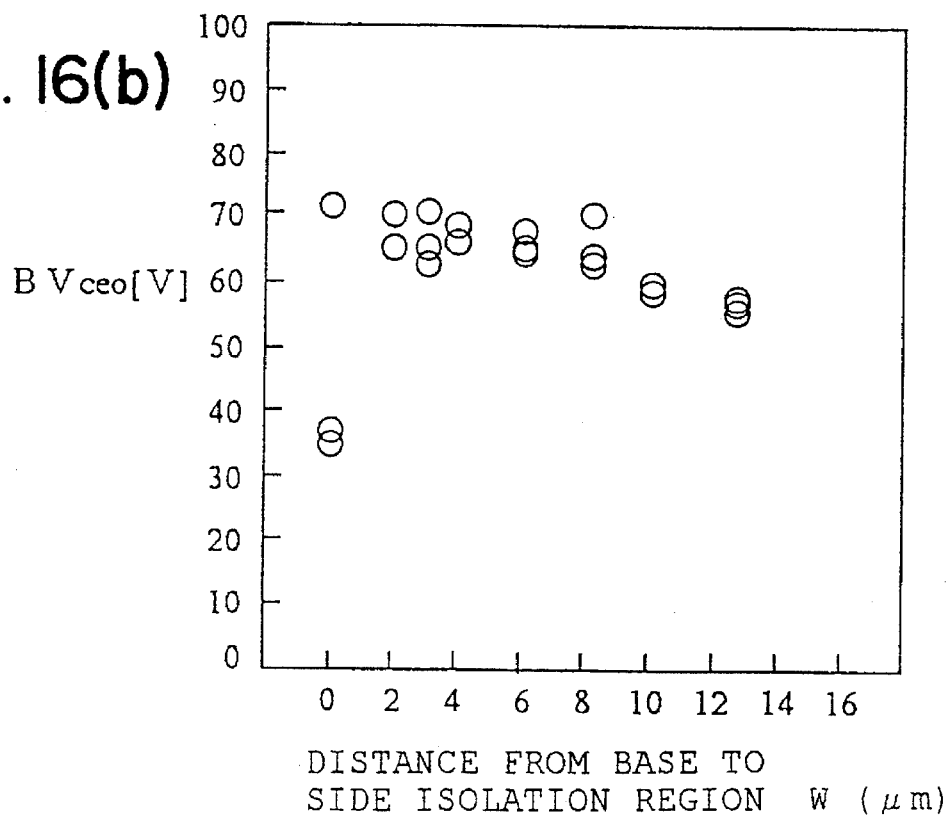

The actual measurements of the change in the collector to base withstand voltage $BV_{CBO}$ with the emitter in the open state were simulated with the distance W between the base region 5 and the side silicon oxide film 9a changed and all the other conditions remaining the same. The measurement results of the withstand voltages are illustrated in FIGS. 16(a) and 16(b). It is understood from these figures that when the depletion layer reaches the side silicon oxide film 9a, $BV_{CBO}$ can be improved.

In FIGS. 9 through 15 and FIGS. 16(a) and 16(b) inclusive, the distance W between the base region 5 and the side silicon oxide film 9a is the distance between the mask opening patterns. The edge of the mask opening pattern displaces by 2.5 μm against the edge of the surface of the base region 5 with the side of the side silicon oxide film 9 set as positive.

Also in this embodiment, because the horizontal area of the collector withstand voltage region 4 can be reduced, the integration degree can also be improved.

Furthermore, in this embodiment, the lateral distance from the base region 5 within the collector withstand voltage region 4 to the side silicon oxide film 9 is set to be smaller than the vertical distance from the base region 5 within the collector withstand voltage region 4 to the buried collector region 3. Therefore, even when the above depletion layer reaches the side silicon oxide film 9, the depletion layer has not yet reached the buried collector region 3. For this arrangement, all the adverse effects of reaching the buried collector region 3 by the depletion layer can be avoided.

Although the above embodiment is an application of the present invention to an NPN bipolar transistor, it can easily be understood that the present invention can also be applied to other types of transistors or diodes.

Second Embodiment

Figure 17:
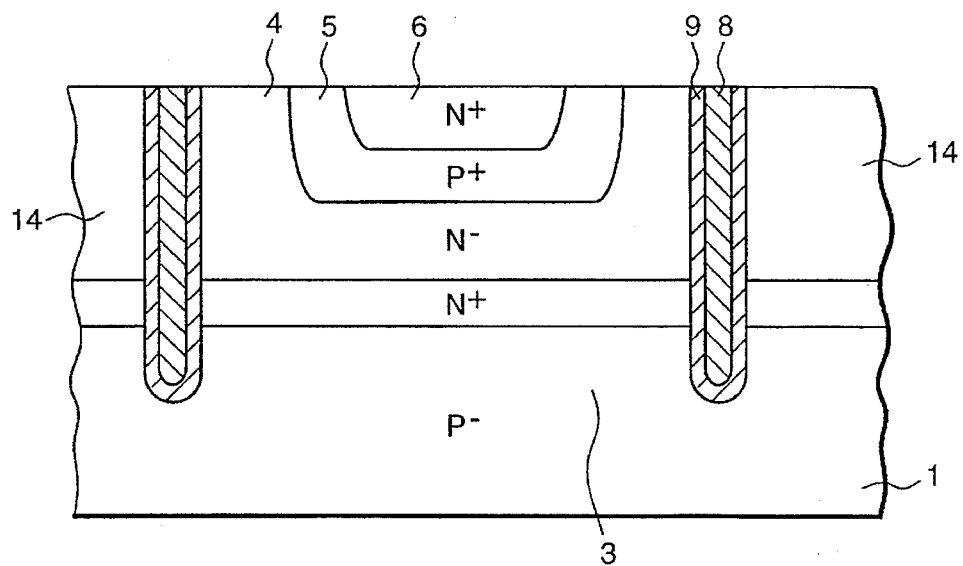
FIG. 17 is a cross-sectional view of a semiconductor device according to the second embodiment.

Another embodiment according to the present invention is illustrated in FIG. 17.

This embodiment is the same as the first embodiment except for that the polysilicon oxide film 2 for the bottom dielectric isolation is omitted. In this embodiment, therefore, there is no need for an SOI substrate, which simplifies the manufacturing processes. In this embodiment, either the semiconductor region outside the side dielectric isolation region 9 or the polysilicon region 8 within the side dielectric isolation region 9 may be taken as an adjacent semiconductor region.

A problem remaining unsolved with the above first and second embodiments is that, due to the formation of the N⁺ collector contact region (surface contact region) 7, the depletion layer can not reach the side silicon oxide film 8 at the side where the base region 5 faces the collector contact region 7. As a result, the withstand voltage in the vicinity of the corner parts of the base region 5 in this portion can not be improved. The measure to counter this problem will now be described referring to the following embodiments.

Third Embodiment

Figure 18:
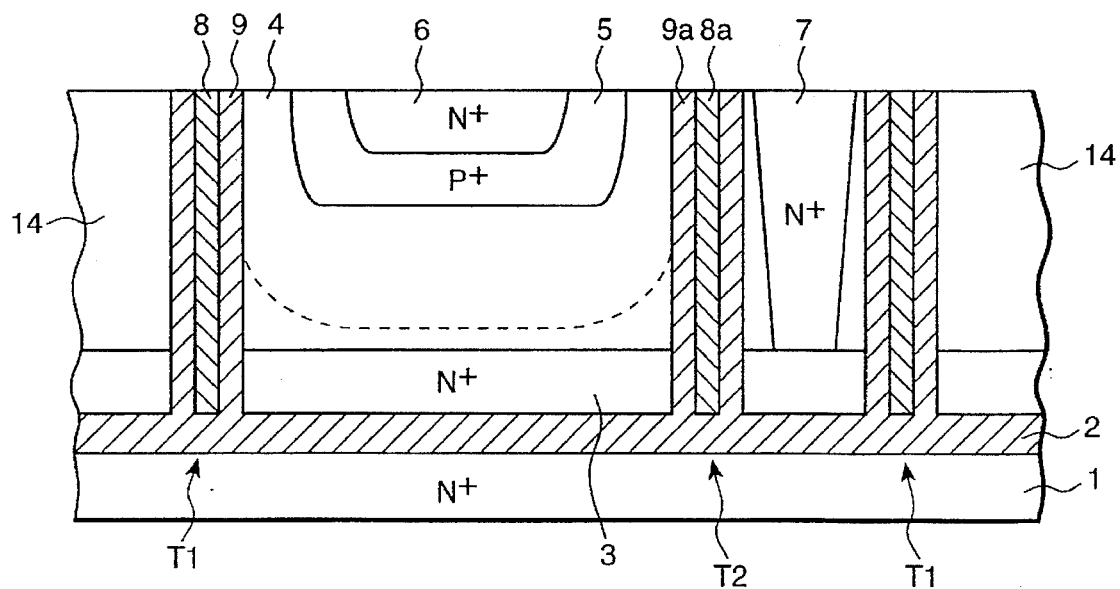
FIG. 18 is a cross-sectional view of a semiconductor device according to the third embodiment.
Figure 19:
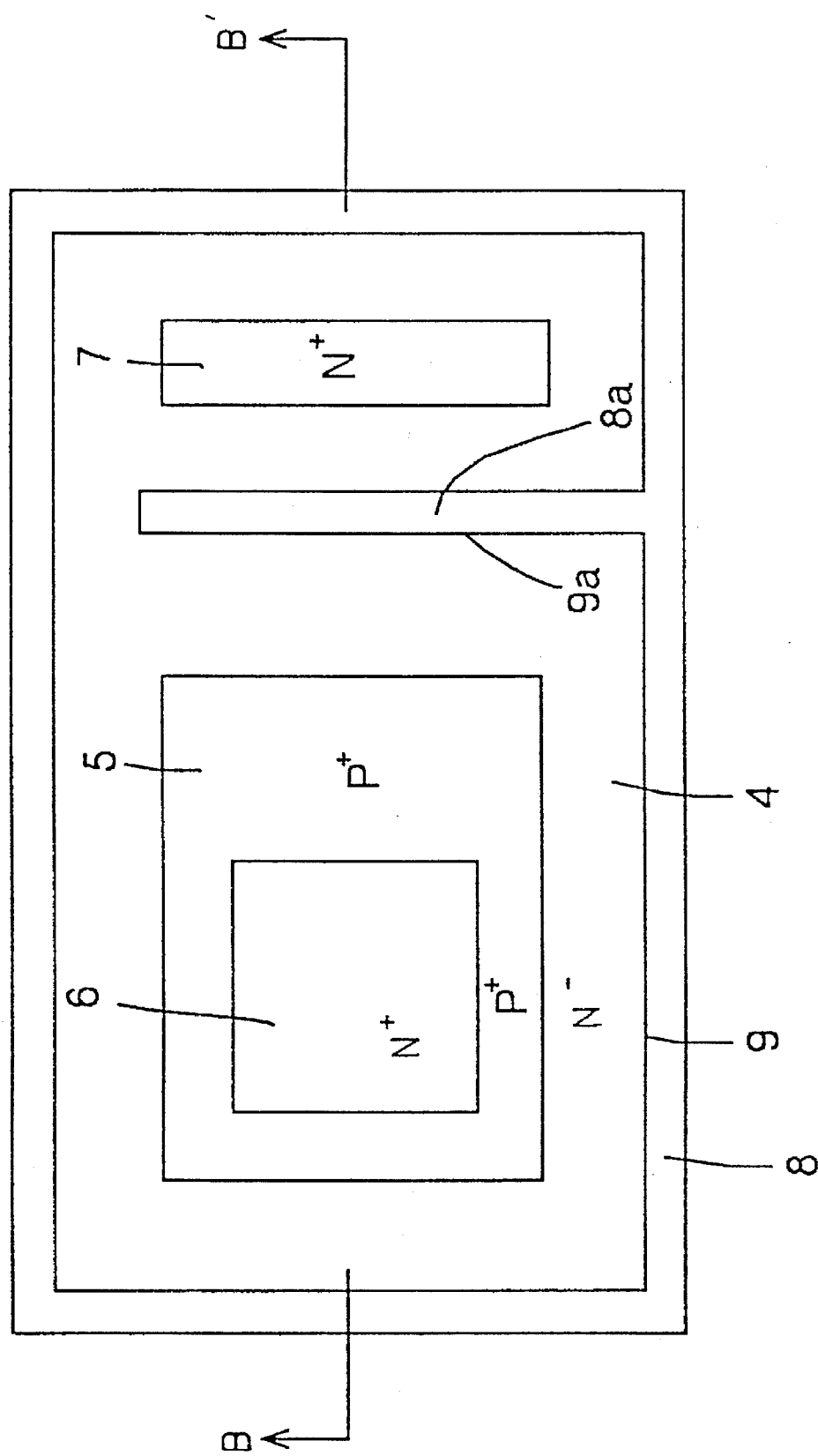
FIG. 19 is a plane view illustrating the semiconductor device according to the third embodiment.

The third embodiment is illustrated in a cross-sectional view in FIG. 18 and in a plane view in FIG. 19, wherein FIG. 18 is the cross-sectional view taken along line B—B' in FIG. 19. As illustrated in these figures, the side silicon oxide film 9a and the polysilicon region 8 are disposed between the N⁺ collector contact region 7 and the base region 5 to reduce the effect of the high electric potential at the collector contact region 7 due to a trench T2 composed of a side silicon oxide film 9b and the polysilicon trench filled region 8 on the vicinity of the corner parts of the base region 5. In this embodiment, the bottom of the trench T2 is connected to the bottom silicon oxide film 2, and an end of the trench T2 is connected to the trench T1 and the other end of the trench T2 is not connected to the trench T1 but suspended.

That is, as illustrated in FIGS. 18 and 19, most parts of the side surface of the collector contact region 7 at the side of the base region 5 are bordered by the trench T2 composed of the side silicon oxide film 9a and the polysilicon region 8. Therefore, the depletion layer between the base and the collector reaches the trench T2, and the electric field can be mitigated by the effect of the low electric potential at the polysilicon area 8.

It can easily be understood that as the bottom of the N⁺ collector contact region 7 is in contact with the N⁺ buried collector region 3, the increase in collector resistance can almost be neglected.

It should be noted here that the trench T2 can be formed at the same time with the formation of the trench T1.

Modifications to the third embodiment will be described below.

Fourth Embodiment

Figure 20:
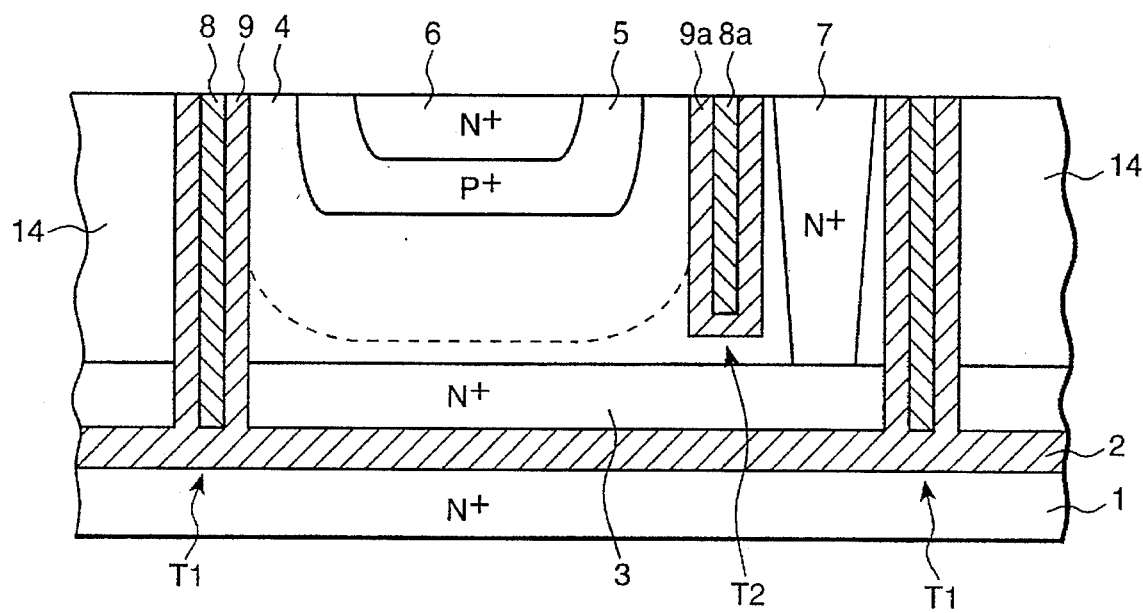
FIG. 20 is a cross-sectional view of a semiconductor device according to the fourth embodiment.
Figure 27:
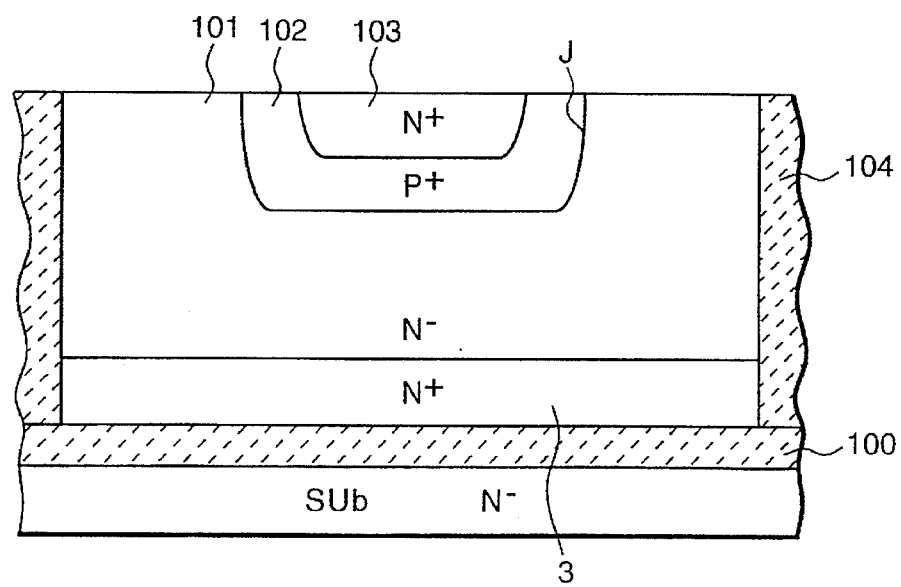
FIG. 27 is a cross-sectional view illustrating a conventional bipolar transistor.

The fourth embodiment is illustrated in a cross-sectional view in FIG. 20 and in a plane view in FIG. 21, wherein FIG. 20 is the cross-sectional view taken along line C—C' in FIG. 21. As illustrated in these figures, the fourth embodiment is a modification to the third embodiment. In this embodiment, the trench T2 is disposed between the N⁺ collector contact region 7 and the base region 5 to reduce the effect of the high electric potential at the collector contact region on the vicinity of the corner parts of the base region 5.

As it is understood from FIG. 20, the trench T2 completely isolates the N⁺ collector contact region 7 from the base region 5.

It should be noted, however, that the bottom of the trench T2 is formed shallower than the upper end of the N⁺ buried collector region 3 so as not to allow the trench T2 to cut off the N⁺ buried collector region 3.

As compared with the third embodiment, this structure can mitigate the entire electric field of the depletion layer between the base region 5 and the surface collector contact region 7, which results in the higher withstand voltage of the collector.

Fifth Embodiment

Figure 22:
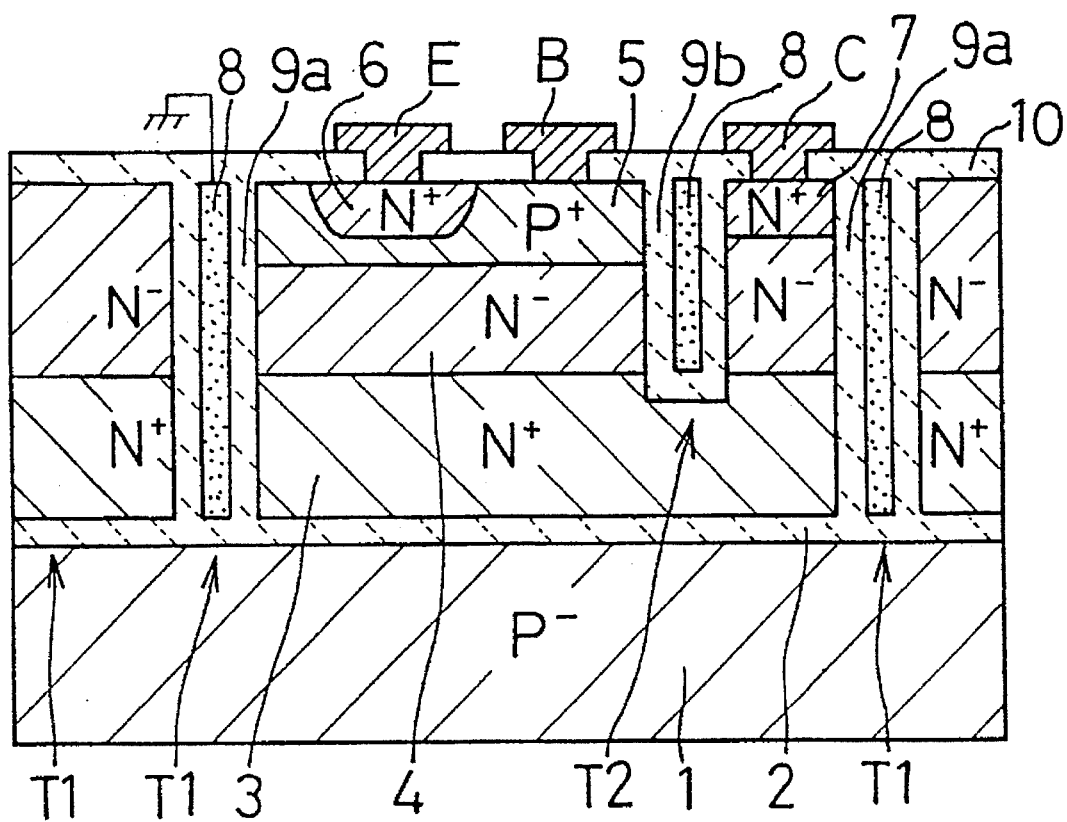
FIG. 22 is a cross-sectional view of a semiconductor device according to the fifth embodiment.

A cross-sectional view of the fifth embodiment is illustrated in FIG. 22. The trench T1 is arranged to be in contact with the base region 5 to reduce the element region and improve the withstand voltage. In this embodiment, the trench T2 is extended laterally to the trench T1, and the trench filled area 8 within the trench T2 is grounded together with the polysilicon trench filled region 8 within the trench T1.

Figure 23:
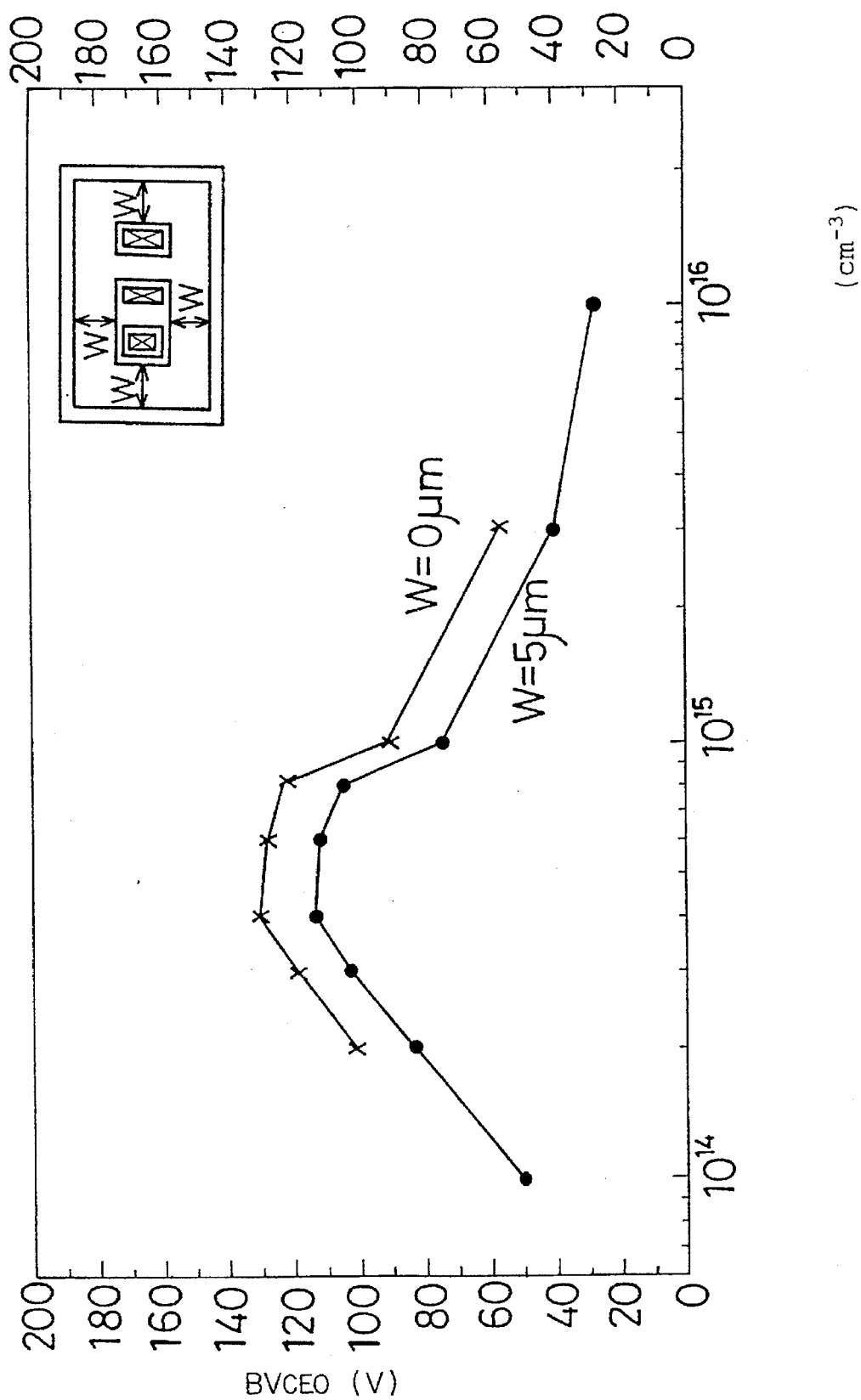
FIG. 23 is a characteristic diagram illustrating the results of the calculation of the relation between the withstand voltage and distance of the semiconductor devices according to the first and fifth embodiments.

The improvement in the withstand voltage is presented in FIG. 23. The plane view of the element framed within this figure is the same as the plane view of the element in FIG. 9, and illustrates as to cases where the distances between the base region 5 and the trench T1 are 5 μm and 0 μm. From this figure, it is understood that when the distance between the base region 5 and the trench T1 is 0 μm, the withstand voltage is higher. In FIG. 23, "W" represents the distance from base to side isolation region.

In the foregoing five embodiments, it has been described in depth that the polysilicon trench filled region 8 within the trench T1 is electrically floated, the outside of the circumferential semiconductor region 14 or the polysilicon trench filled region 8 is grounded, and furthermore both the circumferential semiconductor region 14 and the polysilicon trench filled region 8 may be grounded. Here, a description will be given to the impurity concentration of the polysilicon trench filled region 8.

In electrically floating the polysilicon trench filled region 8, if the impurity concentration thereof is low, the polysilicon trench filled region 8 will be depleted and functions as a dielectric, and, on the other hand, if the impurity concentration thereof is high, the polysilicon trench filled region 8 will electrically leak and be susceptible to some electric potential. Therefore, in this case (the electrodes are not contacted), it is preferable that the impurity concentration of the polysilicon trench filled region 8 should be set to be low.

On the other hand, in a case where the electrodes are contacted and voltage approximate to the electric potential at the emitter is applied thereto, it is preferable that the impurity concentration should be set to such a level that there are some parts left over which are not depleted.

Care should be directed to the fact that in the third, fourth and fifth embodiments, if the polysilicon trench filled region 8 between the $P^+$ base region 5 and the $N^+$ surface collector region 7 (i.e., within the trench T2) is electrically floated, the depletion layer of the $N^-$ collector withstand voltage region 4 beneath the $P^+$ base region 5 will be bent due to the effect of the high electric potential at the $N^+$ surface collector region 7, and as a result, electric field concentration will be promoted and the withstand voltage there will be degraded. Therefore, it is preferable that at least the polysilicon trench filled region 8 of the trench T2 should be set to be high in impurity concentration and settled to the grounding electric potential or any electric potential approximate to the grounding electric potential in order to shut off any electrostatic effect of the surface collector region 7.

Of course, it is acceptable that the polysilicon trench filled region 8 is depleted and the $N^-$ region 11 adjacent to the silicon oxide film 9a is grounded. Even in this case, the withstand voltage can be improved in the collector withstand voltage region 4 other than the silicon oxide film 9b.

Another embodiment in which the polysilicon trench filled region 8 within the trench T2 is electrically floated and the effect of the high electric potential at the $N^+$ surface collector region 7 on the collector withstand voltage region 4 beneath the $P^+$ base region 5 is restrained will now be presented.

Sixth Embodiment

Figure 24:
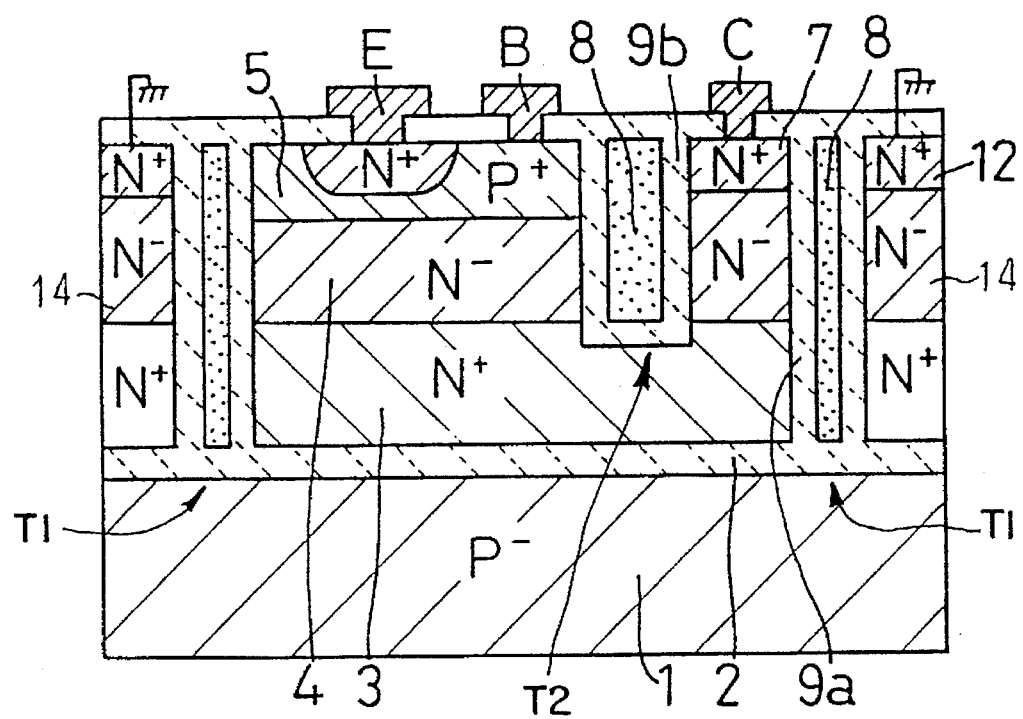
FIG. 24 is a cross-sectional view illustrating a semiconductor device according to the sixth embodiment.

In the sixth embodiment illustrated in FIG. 24, the lateral width of the polysilicon trench filled region 8 within the trench T2 separating the base region 5 and the surface collector region 7 is set to be wider than the lateral width of the polysilicon trench filled region 8 within the trench T1.

In this arrangement, even if the polysilicon trench filled region 8 within the trench T2 is set to be low in impurity concentration to achieve a floating electric potential, the high electric potential at the surface collector region 7 will less easily affect the collector withstand voltage region 4 beneath the base region 5, and as a result, the bending of the depletion layer of the collector withstand voltage region 4 can be reduced and the withstand voltage can be improved.

Furthermore, in the foregoing third, fourth, fifth and sixth embodiments, the impurity concentration of the polysilicon trench filled region 8 within the trench T1 is set to be the same as that of the polysilicon trench filled region 8 within the trench T2. However, the impurity concentration may be set to be different therebetween. For example, only the polysilicon trench filled region 8 within the trench T2 is set to be high in impurity concentration and to the ground electric potential, while the polysilicon trench filled region 8 within the trench T1 may be set to be low in impurity concentration and the $N^-$ region 11 outside the trench T1 may be grounded. This will be embodied as the seventh embodiment as described below.

Seventh Embodiment

Figure 25:
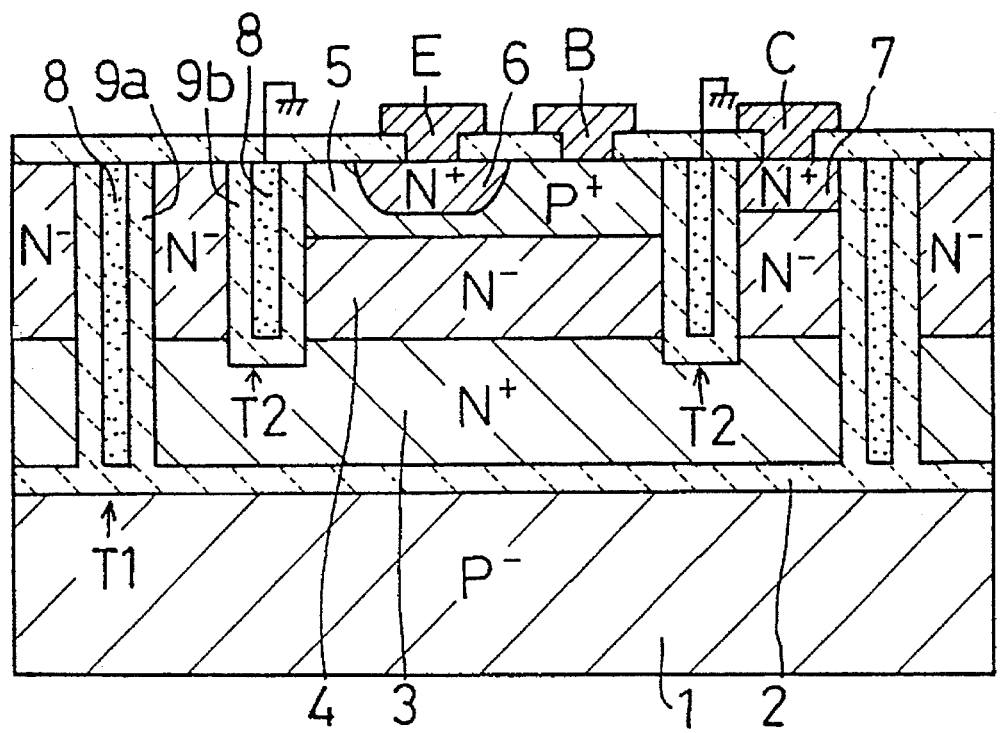
FIG. 25 is a cross-sectional view illustrating a semiconductor device according to the seventh embodiment.
Figure 26:
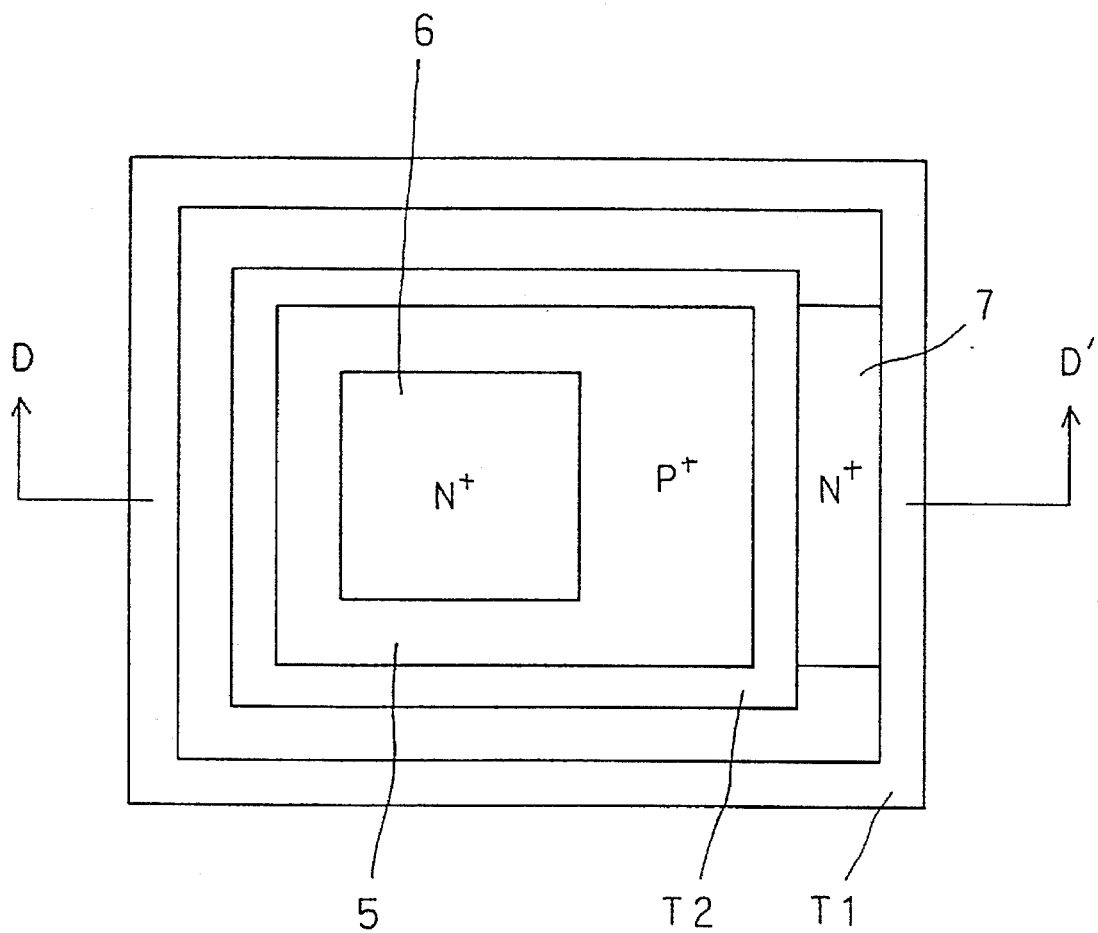
FIG. 26 is a top view illustrating the semiconductor device according to the seventh embodiment.

The seventh embodiment is illustrated in a cross-sectional view in FIG. 25 and in a plane view in FIG. 26, wherein FIG. 25 is a cross-sectional view taken along line D—D' in FIG. 26. As illustrated in these figures, the $P^+$ base region 5 is completely surrounded by the trench T2, i.e., the silicon oxide film 9b, and the polysilicon trench filled region 8 within the trench T2 is set to be high in impurity concentration and grounded. In this arrangement, the polysilicon trench filled region 8 within the trench T1 can be set to be low in impurity concentration, the collector parasitic capacity of the transistor can be reduced, and as a result, the frequency characteristics (operation speed) can be improved while the withstand voltage can be lowered and the size can be reduced.

It is of course that the foregoing embodiments, in which only one bipolar transistor has been presented, can be applied to other transistors or diodes, and also can be applied to the integration of this bipolar transistor with a CMOS, a lateral PNP bipolar transistor, an IIL, etc.

INDUSTRIAL APPLICABILITY

A semiconductor device which is dielectrically isolated at least at the sides according to the present invention can be applied to, for example, a high withstand voltage bipolar transistor (BPT), a high withstand voltage PN junction SIT, a high withstand voltage vertical MIS transistor, etc.

What is claimed is:

1. A semiconductor device comprising:

a semiconductor layer of a first conductivity type formed over a substrate, said semiconductor layer being isolated from said substrate;

an island-shaped semiconductor region of a second conductivity type formed through a surface of said semiconductor layer, said island-shaped semiconductor region having a first impurity concentration which is higher than a second impurity concentration of said semiconductor layer, a reverse-biased pn junction being defined between said semiconductor layer and said island-shaped semiconductor region;

a side dielectric isolation region formed through said surface of said semiconductor layer, said side dielectric isolation region being formed deeper into said semiconductor layer than said island-shaped semiconductor region to thereby define an element region including said island-shaped semiconductor region; and an adjacent semiconductor region disposed adjacent to said element region with said side dielectric isolation region disposed therebetween;

a minimum first distance from said pn junction to said side dielectric isolation region causing a depletion layer to extend through said semiconductor layer from said pn junction to said side dielectric isolation region; and said adjacent semiconductor region having an adjacent electric potential that is more approximate to a first electric potential at said island-shaped semiconductor region than to a second electric potential at said semiconductor layer, whereby said depletion layer is deformed to prevent said pn junction from causing a breakdown.

2. A semiconductor device according to claim 1, wherein:

said semiconductor layer comprises:
   a first high impurity concentration layer, and
   a first low impurity concentration layer;

said island-shaped semiconductor region is formed through a surface of said first low impurity concentration layer of said semiconductor layer; and said minimum first distance from said pn junction to said side dielectric isolation region is smaller than a thickness between a bottom of said island-shaped semiconductor region and a top surface of said first high impurity concentration layer to thereby allow said depletion layer to reach said side dielectric isolation region before said depletion layer reaches said top surface of said first high impurity concentration layer.

3. A semiconductor device according to claim 2, further comprising:

a bottom dielectric isolation region between said substrate and said semiconductor layer;

said side dielectric isolation region reaching said bottom dielectric isolation region.

4. A semiconductor device according to claim 3, wherein:

said side dielectric isolation region is in contact with said island-shaped semiconductor region.

5. A semiconductor device according to claim 3, wherein:

said adjacent semiconductor region comprises a polysilicon region of a high impurity concentration filled within said side dielectric isolation region.

6. A semiconductor device according to claim 1, further comprising:

a surface contact region within said element region and apart from said island-shaped semiconductor region, said surface contact region being of said first conductivity type and having a third impurity concentration which is higher than said second impurity concentration; and a dielectric isolation wall in said element region of said semiconductor layer between said surface contact region and said island-shaped semiconductor region, said dielectric isolation wall dividing said semiconductor layer within said element region into a first region including said island-shaped semiconductor region and a second region including said surface contact region;

said dielectric isolation wall being shallower in said semiconductor layer than said side dielectric isolation region.

7. A semiconductor device according to claim 2, further comprising:

a surface contact region within said element region and apart from said island-shaped semiconductor region, said surface contact region being of said first conductivity type and having a higher impurity concentration than said first low impurity concentration layer of said semiconductor layer; and a dielectric isolation wall in said element region of said semiconductor layer between said surface contact region and said island-shaped semiconductor region said dielectric isolation wall dividing said semiconductor layer within said element region into a first region including said island-shaped semiconductor region and a second region including said surface contact region, said dielectric isolation wall allowing communication between said first region and said second region.

8. A semiconductor device according to claim 3, further comprising:

a surface contact region within said element region and apart from said island-shaped semiconductor region, said surface contact region being of said first conductivity type and having a higher impurity concentration than said first low impurity concentration layer of said semiconductor layer; and a dielectric isolation wall in said element region of said semiconductor layer between said surface contact region and said island-shaped semiconductor region, said dielectric isolation wall dividing said semiconductor layer within said element region into a first region including said island-shaped semiconductor region and a second region including said surface contact region, said dielectric isolation wall allowing communication between said first region and said second region.

9. A semiconductor device according to claim 7 or 8, wherein:

said first region communicates with said second region through a contiguous portion of said semiconductor layer between a side end of said dielectric isolation wall and said side dielectric isolation region.

10. A semiconductor device according to claim 7 or 8, wherein:

said first region communicates with said second region through a contiguous portion of said first high impurity concentration layer of said semiconductor layer passing under said dielectric isolation wall.

11. A semiconductor device according to claim 7 or 8, wherein:

said dielectric isolation wall includes a polysilicon region of high impurity concentration buried therein; and said dielectric isolation wall has an electric potential equal to that at said adjacent semiconductor region.

12. A semiconductor device according to claim 11, wherein:

a minimum second distance from said pn junction to said dielectric isolation wall is equal to said minimum first distance from said pn junction to said side dielectric isolation region.

13. A semiconductor device according to claim 3, wherein:

said electric potential of said adjacent semiconductor causes said adjacent semiconductor to act electrostaticly on said depletion layer.

14. A semiconductor device according to claim 13, wherein:

said adjacent semiconductor region is formed with no semiconductor elements therein.

15. A semiconductor device according to claim 14, wherein said side dielectric isolation region includes:

a polysilicon filler buried therein.

16. A semiconductor device according to claim 14, wherein said adjacent semiconductor region includes:

a second high impurity concentration layer; and a second low impurity concentration layer disposed on said second high impurity concentration layer.

17. A semiconductor device according to any one of claims 1 to 3, 5, and 13 to 16, wherein:

said first minimum distance from said pn junction to said side dielectric isolation region is given by a width of said semiconductor layer between said island-shaped semiconductor region and said side dielectric isolation region.

18. A semiconductor device according to claim 12, wherein:

said first minimum distance from said pn junction to said side dielectric isolation region is given by a width of said semiconductor layer between said island-shaped semiconductor region and said side dielectric isolation region.

19. A semiconductor device according to any one of claims 1 to 3, 5, and 13 to 16, wherein:

said adjacent electric potential is a ground potential.

20. A semiconductor device according to any one of claims 1 to 3, 5, and 13 to 16, wherein said element region further includes:

a LOCOS oxide film formed at a surface thereof;

said island-shaped semiconductor region having a diffusion depth deeper than a bottom of said LOCOS oxide film.

21. A semiconductor device according to claim 17, wherein said element region further includes:

a LOCOS oxide film formed at a surface thereof;

said island-shaped semiconductor region having a diffusion depth deeper than a bottom of said LOCOS oxide film.

22. A semiconductor device according to claim 19, wherein said element region further includes:

a LOCOS oxide film formed at a surface thereof;

said island-shaped semiconductor region having a diffusion depth deeper than a bottom of said LOCOS oxide film.

23. A semiconductor device comprising:

a first semiconductor region of a first conductivity type disposed over a substrate, said first semiconductor region being electrically isolated from said substrate, said first semiconductor region comprising:
  a first high impurity concentration layer, and
  a first low impurity concentration layer disposed on said high impurity concentration layer;

an island-shaped semiconductor region of a second conductivity type disposed within said first low impurity concentration layer, a reverse-biased pn junction being defined between said first low impurity concentration layer and said island-shaped semiconductor region;

a second semiconductor region neighboring said first semiconductor region and disposed over said substrate, said second semiconductor region comprises:
  a second high impurity concentration layer of said first conductivity type positioned adjacently to said first high impurity concentration layer of said first semiconductor region; and a dielectric isolation region disposed between said first semiconductor region and said second semiconductor region, said dielectric isolation region electrically isolating said first semiconductor region from said second semiconductor region, and said island-shaped semiconductor region being apart from said dielectric isolation region, said dielectric isolation region being disposed a distance from said pn junction so as to cause a depletion layer extending from said pn junction to reach through said first low impurity concentration layer to said dielectric isolation region; and said second semiconductor region having a fixed first electric potential approximate to a second electric potential at said island-shaped semiconductor region, whereby said fixed first electric potential of said second semiconductor region causes said depletion layer to deform so as to prevent said pn junction from causing a breakdown.

24. A semiconductor device according to claim 23, further comprising:

an insulating film which electrically isolates said first semiconductor region and said second semiconductor region from said substrate.

25. A semiconductor device according to claim 23 or 24, wherein:

said second semiconductor region is formed with no semiconductor elements therein.

26. A semiconductor device according to claim 23 or 24, wherein said dielectric isolation region includes:

a polysilicon filler buried therein.

27. A semiconductor device according to claim 23 or 24, wherein:

said fixed first electric potential is a ground potential.

28. A semiconductor device according to claim 23 or 24, further comprising:

a LOCOS oxide film formed on a surface of said first semiconductor region;

said island-shaped semiconductor region having a diffusion depth deeper than a bottom of said LOCOS oxide film.

29. A semiconductor device according to any one of claims 1 to 3, further comprising:

a well region of said first conductivity type within said island-shaped semiconductor region;

said well region, said island-shaped semiconductor region, and said semiconductor layer forming a vertical bipolar transistor.

30. A semiconductor device according to any one of claims 1 to 3, wherein:

said adjacent semiconductor region is monocrystalline.

* * * * *